US006946304B2

(12) United States Patent
Shimizu et al.

(10) Patent No.: US 6,946,304 B2
(45) Date of Patent: Sep. 20, 2005

(54) APPARATUS FOR AND METHOD OF MANUFACTURING A SEMICONDUCTOR DEVICE, AND CLEANING METHOD FOR USE IN THE APPARATUS FOR MANUFACTURING A SEMICONDUCTOR DEVICE

(75) Inventors: Takashi Shimizu, Yokohama (JP); Akihito Yamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 10/424,906

(22) Filed: Apr. 29, 2003

(65) Prior Publication Data

US 2004/0002170 A1 Jan. 1, 2004

Related U.S. Application Data

(63) Continuation of application No. PCT/JP02/07206, filed on Jul. 16, 2002.

(30) Foreign Application Priority Data

Aug. 31, 2001 (JP) ....................................... 2001-264867

(51) Int. Cl.[7] .......................... H01L 21/00; C23C 16/00
(52) U.S. Cl. .......................................... 438/14; 118/715
(58) Field of Search ............................ 438/14; 118/689, 118/708, 712, 715

(56) References Cited

U.S. PATENT DOCUMENTS 5,834,371 A * 11/1998 Ameen et al. .............. 438/656
6,077,355 A 6/2000 Yamashita et al.
2001/0000865 A1 * 5/2001 Gaughen et al. ........... 118/50.1
2002/0066535 A1 * 6/2002 Brown et al. .......... 156/345.29
2003/0200924 A1 * 10/2003 Ko et al. .................... 118/715

FOREIGN PATENT DOCUMENTS

| | | |
|---|---|---|
| JP | 3-18016 | 1/1991 |
| JP | 8-186103 | 7/1996 |
| JP | 10-12601 | 1/1998 |
| JP | 10-50686 | 2/1998 |

* cited by examiner

*Primary Examiner*—W. David Coleman
(74) *Attorney, Agent, or Firm*—Finnegan, Henderson, Farabow, Garrett & Dunner, LLP.

(57) ABSTRACT

An apparatus for manufacturing a semiconductor device, comprising a process chamber which holds a substrate to be subjected to a prescribed process, a gas inlet pipe which introduces a process gas into the process chamber, a gas outlet pipe which discharges the gas from the process chamber to outside the process chamber, component-measuring devices which measure components of the gas in the process chamber or at least two different gases, concentration-measuring devices which measure concentration of each component of the gas in the process chamber, or the concentration of each component of at least two different gases, and a control device which adjusts the components of the process gas, the concentration of each component of the process gas and an atmosphere in the process chamber, on the basis of values measured by the composition-measuring device and concentration-measuring device.

8 Claims, 6 Drawing Sheets

APPARATUS FOR AND METHOD OF MANUFACTURING A SEMICONDUCTOR DEVICE, AND CLEANING METHOD FOR USE IN THE APPARATUS FOR MANUFACTURING A SEMICONDUCTOR DEVICE

CROSS-REFERENCE TO RELATED APPLICATIONS

This is a Continuation Application of PCT Application No. PCT/JP02/07206, filed Jul. 16, 2002, which was not published under PCT Article 21(2) in English.

This application is based upon and claims the benefit of priority from the prior Japanese Patent Application No. 2001-264867, filed Aug. 31, 2001, the entire contents of which are incorporated herein by reference.

BACKGROUND OF THE INVENTION

1. Field of the Invention

The present invention relates to an apparatus for and method of manufacturing a semiconductor device, and a cleaning method for use in the apparatus for manufacturing a semiconductor device. Particularly, the invention relates to an apparatus for and method of manufacturing a semiconductor device, which are designed to perform hot processes, such as thermal oxidation, annealing, CVD and RTP, in manufacturing the semiconductor device, and also to a cleaning method for use in the apparatus for manufacturing a semiconductor device.

2. Description of the Related Art

In processes of manufacturing a semiconductor device, the steps of forming thin films on the semiconductor substrate (wafer) are very important. Each film-forming step utilizes thermal reaction, chemical reaction or the like between a feed gas and silicon, i.e., the representative material of the wafer, and a feed gas, or between various feed gases. So-called "hot processes," such as thermal oxidation, thermal nitriding, annealing, rapid thermal process (RTP), and chemical vapor deposition (CVD), are particularly important.

Generally, these steps are carried out by introducing feed gases into the reaction furnace of a film-forming apparatus, in which one or more silicon wafers, i.e., semiconductor substrates, have been placed. To form films of desired properties (e.g., thickness, composition, resistance, etc.), the flow rates of the feed gases, the pressure and temperature in the reaction furnace and the processing time are preset. A controller controls the film-forming apparatus, causing the apparatus to operate in accordance with the preset values. In recent years, the internal microstructure of semiconductor devices has grown remarkably complex and acquired high component concentration. It is therefore very important to form high-quality thin films so that the semiconductor device that is a complicated and high-performance device may operate reliably in stable conditions. To this end, it increasing necessary to control, with very high precision, the various parameters (film-forming parameters) including the flow rates of feed gases, the pressure and temperature in the reaction furnace and the process time, all mentioned above.

As has been pointed out, it has become more necessary to control, with high accuracy, the film-forming parameters applied in the film-forming step in order to provide high-quality thin films. With ordinary film-forming apparatuses, however, some of the film-forming parameters cannot be controlled with so high a precision as desired, even if the controller for controlling the film-forming parameters is improved in terms of control ability.

A thermal oxidation process may be repeated several times (in several runs). In this case, the film-forming conditions are set so that a film may be formed each time (in each run) at the same conditions, such as oxidation temperature, flow rate of oxygen and pressure of oxygen. Theoretically, any thin film formed at one time should have almost the same thickness as the thin film formed at any other time. In practice, however, a difference in thickness, which cannot be neglected or allowed, may exist between the thin film formed in one run and the thin film formed in any other run.

Some reasons for this difference in thickness can be considered. For example, the partial pressure that the oxidizer assumes in the oxidization furnace may varies from run to run, due to any factor other than the flow rate of the oxygen being introduced into the oxidation furnace and the pressure of the oxygen introduced in the oxidation furnace. More specifically, if the process using water is performed in one run, some of the water may remain adsorbed in the furnace, not purged from the reaction furnace before the next run. In this case, the water acts as an oxidizer in the furnace. The oxide film formed while the water remains in the furnace is inevitably thicker than the film formed in a film-forming step at which water scarcely exists in the furnace.

In any film-forming apparatus that has a reaction furnace the interior of which is exposed to the atmosphere, the water in the atmosphere is taken into the reaction furnace when a wafer is brought into the furnace for each run. If so, the temperature in the furnace may differ from run to run, because the water concentration (humidity) in the atmosphere is not always the same at the start and end of any run.

The amount of the water adsorbed in the reaction furnace or of the water taken from the atmosphere into the furnace is extremely unstable. That is, it changes very much. Therefore, the amount of the water adsorbed or taken into the furnace is not set as a controllable parameter in the ordinary film-forming apparatuses. Even if the amount of the water is set as a film-forming parameter, oxide films may greatly differ in thickness so long as the apparatus that forms them performs a film-forming process using water or has a reaction furnace whose interior is exposed to the atmosphere.

A method many be devised, in which any very unstable factor, such as the amount of water outside the furnace, is not used as a film-forming parameter and a factor such as the components of the exhaust gas discharged from the furnace and containing feed gas used in the film-forming step is analyzed (measured, observed and monitored). Thus, the state of gas and the atmosphere, both in the furnace, during the film-forming step may be determined and then controlled to be appropriate ones. In this method, however, neither the state of gas nor the atmosphere in the furnace is accurately monitored.

This is because the component, concentration and the like of the feed gas introduced into the reaction furnace may largely differ from those the feed gas assumes outside the reaction furnace. That is, the components, concentration and the like of the feed gas may have different values each, before, during and after the film-forming step, depending on the thermal or chemical reaction that takes place during the film-forming step. Particularly, the more reactive or decomposable the feed gas is, the more greatly its components, concentration, etc. vary with time. Further, the composition, concentration and the like of the feed gas, thus analyzed, may greatly differ, depending upon the positions of the analyzers employed to analyze them.

The thickness of the film differs, from run to run, probably because of the residual feed gas accumulated in the reaction furnace. For example, the components of the feed gas fail to be reacted completely in one run and may adhere to the inner surface of the reaction furnace and may be solidify. When the next run is performed in this condition, any solid component of the gas, on the inner surface of the furnace, changes to gas due to the heat in the reaction furnace. In the next run, this gas mixes with the feed gas newly supplied into the reaction furnace. Consequently, the amount of feed gas in the reaction chamber increases over the constant value for each run. In other words, the amount of feed gas differs, from run to run. It follows that the thickness of the film varies, from run to run. The more runs are carried out, the more residue of the feed gas will likely be accumulated in the reaction furnace. This phenomenon is prominent in proportion to the number of runs carried out.

One film-forming apparatus may perform different film-forming steps. In this case, the material used to form a film differs from step to step. If the components of the material used in one film-forming step remain not completely reacted in the reaction furnace, it may be mixed with the feed gas in the next film-forming step, though it is unnecessary in the next step. If this component is mixed, the thin film formed in the next step may have not only a thickness greatly differing from the design value, but also properties totally undesired or extremely poor.

BRIEF SUMMARY OF THE INVENTION

According to an aspect of the invention, there is provided an apparatus for manufacturing a semiconductor device. The apparatus comprises: a process chamber which holds a substrate to be subjected to a prescribed process; a gas inlet pipe which is connected and communicates with an interior of the process chamber and which introduces a process gas for use in the process, into the process chamber; a gas outlet pipe which is connected and communicates with the interior of the process chamber and which discharges the gas from the process chamber to outside the process chamber; component-measuring devices which are provided at two or more positions selected from the group comprising of a position in the process chamber, a position in the gas inlet pipe and a position in the gas outlet pipe, and which measure components of the gas in the process chamber or at least two different gases selected from the group comprising of gas in the process chamber, gas to be introduced into the process chamber and gas discharged from the process chamber; concentration-measuring devices which are provided at two or more positions selected from the group comprising of a position in the process chamber, a position in the gas inlet pipe and a position in the gas outlet pipe, and which measure concentration of each component of the gas in the process chamber, or the concentration of each component of at least two different gases selected from the group comprising of the gas in the process chamber, the gas to be introduced into the process chamber and the gas discharged from the process chamber; and a control device which adjusts the components of the process gas, the concentration of each component of the process gas and an atmosphere in the process chamber, on the basis of values measured by the composition-measuring device and concentration-measuring device, such that an appropriate process is performed on the substrate.

According to another aspect of the invention, in which a substrate to be processed is held in a process chamber and a process gas is introduced into the process chamber to perform a prescribed process on the substrate, there is provided a method of manufacturing a semiconductor device. The method comprises: measuring components of the gas in the process chamber or at least two different gases selected from the group comprising of gas in the process chamber, gas to be introduced into the process chamber and gas discharged from the process chamber and also measuring a concentration of each component of the gas or gases, at two or more positions selected from the group comprising of a position in the process chamber, a position in a gas inlet pipe and a position in a gas outlet pipe, the gas inlet pipe being connected and communicating with an interior of the process chamber and configured to introduce the process gas for use in the process, into the process chamber, and the gas outlet pipe being connected and communicating with the interior of the process chamber and configured to discharge the gas from the process chamber to outside the process chamber; and adjusting the concentration of each component of the process gas and an atmosphere in the process chamber, on the basis of values thus measured, such that an appropriate process is performed on the substrate.

According to a further aspect of the invention, there is provided a cleaning method for use in an apparatus for manufacturing a semiconductor device. The cleaning method comprises: measuring components of gas in a process chamber or at least two different gases selected from the group comprising of gas in the process chamber, gas to be introduced into the process chamber and gas discharged from the process chamber, and measuring concentration of each component of any of these gases, at two or more positions selected from the group comprising of a position in the process chamber, a position in a gas inlet pipe and a position in a gas outlet pipe for discharging gases from the process chamber, the process gas having been introduced into the process chamber which holds a substrate to undergo a prescribed process, the gas inlet pipe connected and communicating with an interior of the process chamber to introduce a process gas into the process chamber and the gas outlet pipe connected and communicating with the interior of the process chamber to discharge gases from the process chamber; performing the prescribed process on the substrate, while adjusting the components of the process gas, the concentration of each component of the process gas and an atmosphere in the process chamber, on the basis of the values measured, so that the process is performed on the substrate in an appropriate manner; taking the substrate from the process chamber after the substrate has been subjected to the prescribed process; generating a cleaning gas on the basis of the values measured, the cleaning gas having such components and such concentration as to remove residues from the gas inlet pipe, process chamber and gas outlet pipe of the apparatus; and applying the cleaning gas from the gas inlet pipe to the gas outlet pipe through the process chamber.

DETAILED DESCRIPTION OF THE INVENTION

Embodiments of the invention will be described in detail with reference to the accompanying drawings.

(First Embodiment)

First, the apparatus for manufacturing a semiconductor device, method of manufacturing a semiconductor device and cleaning method for use in the apparatus, all according to the first embodiment of the invention, will be described with reference to FIGS. 1 and 2.

Figure 1:
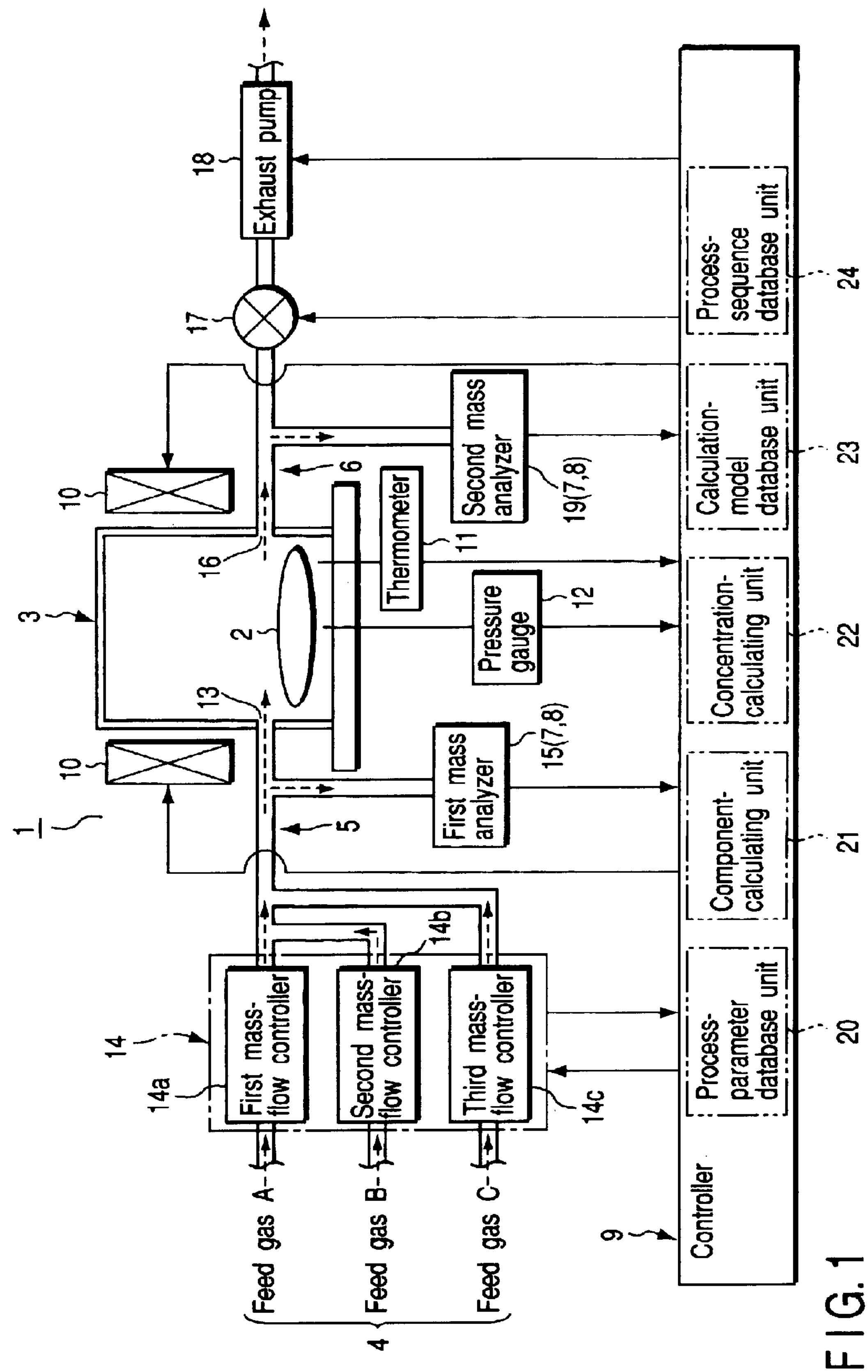
FIG. 1 is a schematic diagram showing the structure of a film-forming apparatus that is an apparatus for manufacturing a semiconductor device, according to the first embodiment of the present invention.
Figure 2:
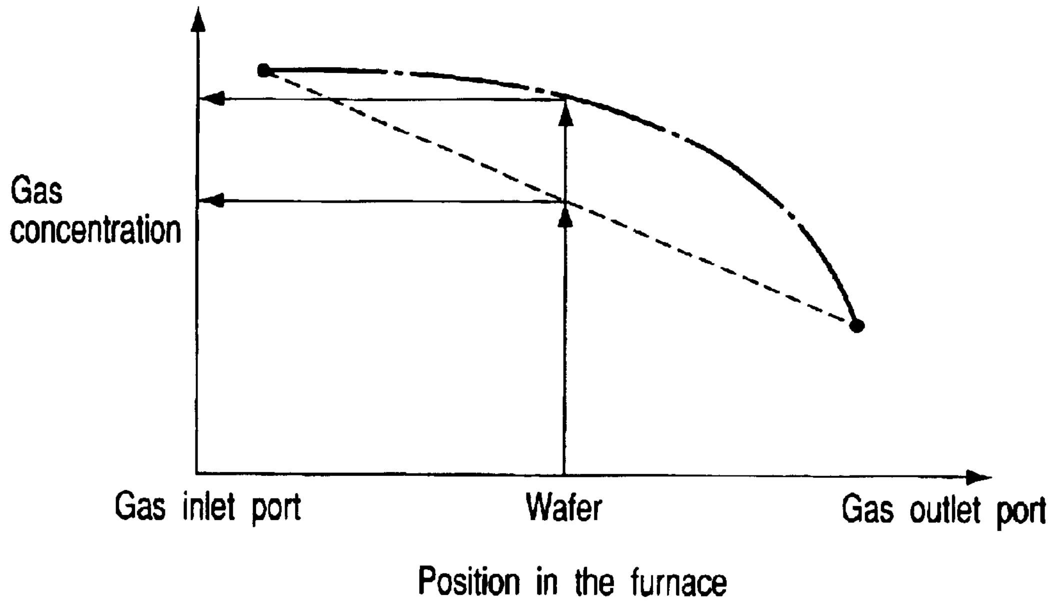
FIG. 2 is a graph explaining a method of determining the gas concentration in the reaction furnace provided in the film-forming apparatus shown in FIG. 1.

FIG. 1 is a schematic diagram depicting the structure of the apparatus 1 for manufacturing a semiconductor device, according to the first embodiment. FIG. 2 is a graph explaining a method of determining the gas concentration at a predetermined position in the processing chamber 3 that is provided in the apparatus 1 shown in FIG. 1.

As FIG. 1 shows, the apparatus 1 for manufacturing a semiconductor device, according to this embodiment, comprises a process chamber 3, a gas inlet pipe 5, gas outlet pipe 6, component-measuring devices 7, concentration-measuring devices 8, a controller 9, and the like. The process chamber 3 may hold a substrate 2 to be subjected to a specific process. The gas inlet pipe 5 introduces a process gas 4 into the process chamber 3. The gas outlet pipe 6 exhausts gas from the process chamber 3. One component-measuring device 7 is provided on the gas inlet pipe 5 to measure the components of the process gas being introduced into the process chamber 3. One concentration-measuring device 8 is provided on the gas inlet pipe 5, too, to measure the concentration of each component of the process gas 4 being introduced into the chamber 3. The other component-measuring device 7 is provided on the gas outlet pipe 6 to measure the components of the gas being exhausted from the process chamber 3. The other concentration-measuring device 8 is provided on the gas outlet pipe 6, too, to measure the concentration of each component of the gas being exhausted from the chamber 3. The controller 9 controls the components of the process gas 4, the concentration of each component of the gas 4 and the atmosphere in the process chamber 3, in accordance with the values measured by the component-measuring devices 7 and concentration-measuring devices 8. Thus, an appropriate process may be performed on the substrate 2.

The apparatus for manufacturing a semiconductor device, according to this embodiment, is a film-forming apparatus 1 of so-called "single-wafer processing type." Namely, this apparatus forms films on one wafer 2, i.e., the substrate held in the process chamber 3 and being processed.

Outside the reaction furnace 3, or process chamber, a plurality of heaters 10 are provided. They function as a temperature-adjusting device that sets the temperature in the reaction furnace 3 at a predetermined value. A thermometer 11 and a pressure gauge 12 are attached to the reaction chamber 3. The thermometer 11 measures the temperature in the furnace 3. The pressure gauge 12 measures the pressure in the furnace 3.

The gas inlet pipe 5 is connected to the reaction furnace 3 and communicates with the interior of the furnace 3. The pipe 5 has a gas inlet port 13 at the end that communicates with the interior of the furnace 3. The port 13 guides the process gas 4 from the gas inlet pipe 5 into the reaction furnace 3. Thus, the process gas 4 is introduced into the reaction furnace 3 through the gas inlet port 13 after passing through the gas inlet pipe 5.

As a one-dot dashed line indicates in FIG. 1, mass-flow controllers 14 are connected to one end of the gas inlet pipe 5, which is connected at the other end to the reaction furnace 3. The mass-flow controllers 14 are provided, each serving as a feed-supplying device for supplying one process gas 4 into the gas inlet pipe 5. In this embodiment, three feed gases A, B and C are used as process gases 4. Hence, the embodiment has three mass-flow controllers **14*a*, 14*b* and 14*c*. The first mass-flow controller 14*a* supplies the first feed gas A. The first mass-flow controller 14*b* supplies the first feed gas B. The third mass-flow controller 14*c*** supplies the first feed gas C.

A component-measuring device 7 and a concentration-measuring device 8 are connected to that part of the gas inlet pipe 5, which lies upstream of the gas flow indicated by a broken line in FIG. 1, with respect to the gas inlet port 14. The component-measuring device 7 monitors the components of the process gas being introduced into the reaction chamber 3. The concentration-measuring device 8 monitors the concentration of each component of the process gas 4 being introduced into the chamber 3. The component-measuring device 7 and the concentration-measuring device 8, both connected to the gas inlet pipe 5, are formed integral with each other in the present embodiment. More specifically, the devices 7 and 8 constitute a mass analyzer that can measure the components of the process gas 4 and the concentration of each gas component at the same time. The mass analyzer, which measures the components of the process gas 4 being introduced into the reaction furnace 3 and the concentration of each component of the process gas 4, shall be referred to as "first mass analyzer 15."

More precisely, the first mass analyzer 15 can measure, at the same time, the composition of the process gas 4 composed of feed gases A, B and C and being introduced into the reaction furnace 3, and the concentrations, or contents (composition ratios), of the feed gases A, B and C.

The gas outlet pipe 6 is connected to the reaction furnace 3, communicating with the interior thereof, and lies downstream of the gas flow indicated by the broken line in FIG. 1, with respect to the gas inlet pipe 5. The wafer 2 held in the reaction furnace 3 is located between the gas inlet pipe 5 and the gas outlet pipe 6. The gas outlet pipe 6 has a gas outlet port 16 at the end that communicates with the interior of the reaction furnace 3. The gas outlet port 16 guides gases from inside the reaction furnace 3 into the gas outlet pipe 6. Thus, the gases are discharged from the reaction furnace 3 first through the gas outlet port 16 and then through the gas outlet pipe 6.

A switch valve 17 and an exhaust pump 18 are provided on that part of the gas outlet pipe 6, which is remote from the junction of the pipe 6 and the reaction furnace 3. The switch valve 17 and exhaust pump 18 are operated and stopped, to discharge the gases from the reaction furnace 3 via the gas outlet pipe 6. In this embodiment, the switch valve 17 functions as a pressure control valve to maintain the pressure in the reaction furnace 3 at a preset value while the exhaust pump 18 is operating and at another preset value while the pump 18 remains stopped.

A component-measuring device 7 and a concentration-measuring device 8 are connected to that part of the gas outlet pipe 6, which lies near the gas outlet port 16 and upstream of the gas flow indicated by a broken line in FIG. 1, with respect to the gas outlet port 16. The component-measuring device 7 monitors the components of the gas discharged from the reaction chamber 3. The concentration-measuring device 8 monitors the concentration of each component of the gas discharged from the chamber 3. The component-measuring device 7 and the concentration-measuring device 8, both connected to the gas outlet pipe 6, are formed integral with each other in the present embodiment, like the devices 7 and 8 connected to the gas inlet pipe 5. More correctly, the devices 7 and 8 constitute a mass analyzer that can measure the components of the gas discharged from the reaction furnace 3 and the concentration of each gas component at the same time. The mass analyzer, which measures the components of the gas discharged from the reaction furnace 3 and the concentration of each component of the gas, shall be referred to as "second mass analyzer 19."

To be more specific, the second mass analyzer 19 can measure, at the same time, the composition of the gas (exhaust gas) discharged from the reaction furnace 3 and the concentrations, or contents (composition ratios), of the components of the exhaust gas. Note that the exhaust gas is composed of process gas 4 that has been introduced into the reaction furnace 3 but not used in the film-forming reaction, process gas 4 that has been introduced into the reaction furnace 4 and contributed to the film-forming reaction, process gas 4 that has been used in the film-forming reaction, and the like.

As described above, in the film-forming apparatus according to the first embodiment, the first mass analyzer 15 and the second mass analyzer 19 are provided at the upstream and downstream sides of the wafer 2 held in the reaction furnace 3. Namely, the mass analyzers 15 and 19 are located upstream and downstream, respectively, with respect to the gas that flows in the reaction furnace 3, from the gas inlet pipe 5 to the gas outlet pipe 6 as is indicated by the broken line in FIG. 1.

The controller 9, used as a control device, is connected to the heaters 10, thermometer 11, pressure gauge 12, first to third mass-flow controllers 14*a*, 14*b* and 14*c*, first mass analyzer 15, second mass analyzer 19, switch valve 17, exhaust pump 18, and the like. The solid-line arrows shown in FIG. 1 indicate the directions in which electric signals flow between the devices connected to the controller 9. In FIG. 1, the first to third mass-flow controllers 14*a*, 14*b* and 14*c* are depicted as a single mass-flow controller 14, thus simplifying the figure. The controller 14 receives and transmits signals from and to the controller 9, so that the controller 9 may control the controllers 14*a*, 14*b* and 14*c*. In fact, however, the first to third mass-flow controllers 14*a*, 14*b* and 14*c* exchange signals with the controller 9, each independently of the other mass-flow controllers. Hence, the controller 9 controls each mass-flow controller, independently of the two other mass-flow controllers.

The controller 9 is designed to determine with high precision the conditions in which a thin film is being formed, from the signals sent from the thermometer 11, pressure gauge 12, first to third mass-flow controllers 14*a*, 14*b* and 14*c*, first mass analyzer 15, second mass analyzer 19, and the like.

A plurality of process parameters of various types has been given to the controller 9. They are optimal for controlling the components of the process gas 4, the concentration of each component of the gas 4, temperature and pressure in the reaction furnace 3 and condition of forming a film. Hence, the film can be formed on the wafer 2 in optimal conditions. In other words, the process parameters set the best possible conditions (i.e., actual environment) for forming a film on the wafer 2, to manufacture a semiconductor device that has thin films of the quality desired.

The process parameters can be obtained by, for example, experiments or computer simulations. In the film-forming apparatus 1 of this embodiment, the process parameters are stored in a process-parameter database unit 20 indicated by two-dot dashed line in FIG. 1. The more process parameters the process-parameter database unit 20 stores, the more accurately can the components of the process gas 4, concentration of each component of the gas 4, temperature and pressure in the reaction function 3 and condition of forming a film be controlled to optimal ones.

The thermometer 11 and the pressure gauge 12 measure the temperature and pressure in the reaction furnace 3 at prescribed time intervals. They generate electric signals representing the values they have measured (i.e., measured value data), which are sent to the controller 9. After receiving these electric signals, the controller 9 adjusts the operating conditions of the heaters 10, switch valve 17, exhaust pump 18 and the like to appropriate ones in accordance with the process parameter already given to it. The film-forming process may therefore be performed on the wafer 2 in optimal conditions.

The controller 9 incorporated in the present embodiment is designed to control the components of the process gas 4 and the concentration of each component of the gas 4 to proper value, on the basis of the gas components and gas component concentrations (i.e., measured value data) that the first mass analyzer 15 and second mass analyzer 19 have measured at the positions they are located. Thus, the film-forming process can be carried out on the wafer 2 in appropriate conditions. The controller 9 used in this embodiment is designed, also to utilize the preset data, such as the flow rates and flow speeds of the feed gases A, B and C, as data for appropriately controlling the components of the process gas 4 and the concentration of each component of the gas 4.

The first mass analyzer 15 and second mass analyzer 19 measure the gas components and gas component concentrations, at the positions they are located and at predetermined time intervals. They generates electric signal representing the values measured (i.e., measured value data). The electric signals are supplied to the controller 9. The controller 9 receives electric signals also from the first to third flow-mass meters 14*a*, 14*b* and 14*c*. The controller 14*a* measures the flow rate and flow speed of the feed gas A flowing through it, the controller 14 measures the flow rate and flow speed of the feed gas B, and the controller 14*a* measures the flow rate and flow speed of the feed gas C flowing through it, each at different time intervals. The first to third controllers 14*a*, 14*b* and 14*c* generate electric signals (i.e., preset data) that represent the flow rates and flow speeds of the gases A, B and C. These signals are sent to the controller 9. Upon receipt of the signals, the controller 9 adjusts the operating conditions of the first to third mass-flow controllers 14_a_, 14_b_ and 14_c_ on the basis of the process parameters it already has, so that the film-forming process may be performed on the wafer 2 in appropriate conditions. Namely, the controller 9 adjusts the flow rates and flow speeds of the feed gases A, B and C flowing through the mass-flow controllers 14_a_, 14_b_ and 14_c_ in accordance with the process parameters, to appropriate values whenever necessary. Thus, the film-forming process may be carried out on the wafer 2 in appropriate conditions.

The controller 9 is configured to control the condition of forming a film, in accordance with the process parameters, thereby to perform the film-forming process on the wafer 2 in appropriate conditions. More precisely, the controller 9 can set the time of the film-forming process at a predetermined value, which is required until a semiconductor device having thin films of desired quality, in accordance with the process parameters.

Moreover, in the film-forming apparatus 1 according to this embodiment has a component-calculating unit 21 and a concentration-calculating unit 22. The component-calculating unit 21 calculates, from the gas components (measured data) measured by the first and second mass analyzers 15 and 19, the components that the gas has at a predetermined position in the reaction furnace 3 and at the same time the analyzers 15 and 19 measure the components of the gas. The concentration-calculating unit 22 calculates, from the component concentration (measured data) measured by the analyzers 15 and 19, the concentration that each gas component has at said position in the reaction furnace 3 and at the same time the analyzers 15 and 19 measure the concentration of the gas component. The component-calculating unit 21 and concentration-calculating unit 22 are designed to calculate the components that the gas has at the predetermined position in the reaction furnace 3 and the concentration each gas component has at the predetermined position, at prescribed time intervals as the first and second mass analyzers 15 and 19 do operate. In the film-forming apparatus 1 of the present embodiment, the component-calculating unit 21 and concentration-calculating unit 22 are incorporated in the controller 9, as may be indicated by two-dot dashed lines in FIG. 1.

A calculation model for finding the concentration that one component of the gas has at the predetermined position in the reaction furnace 3 will be explained, with reference to FIG. 2. In the film-forming apparatus 1 according to this embodiment, the first mass analyzer 15 provided near the gas inlet port 13 monitors the components of the gas and the concentration of each gas component, and the second mass analyzer 19 provided near the gas outlet port 16 monitors the components of the gas and the concentration of each gas component. In this case, the simplest calculation model may be used to find the concentration of one gas component in the form of an interpolated value on a linear function (straight line) that connects two values measured by the first and second mass analyzers 15 and 19, respectively.

During the film-forming process, however, the components that the gas has at the predetermined position in the reaction furnace 3 and the concentration that each gas component has at the predetermined position are too complex to be expressed as a linear function as mentioned above. Therefore, a more complex calculation model should better be used in order to find more accurately the concentration of one gas component at the predetermined position in the reaction furnace 3. This calculation model finds the concentration by interpolation, or by connecting the values measured by the first mass analyzer 15 and second mass analyzer 19 by a complex function (curve), as is indicated by the one-dot dashed lines in FIG. 1.

The calculation models explained above are used in the same way in order to measure the components that the gas has at the predetermined position in the reaction furnace 3.

The calculation models for measuring the components the gas has at the predetermined position in the reaction furnace 3 and the concentration of each gas component can be attained by, for example, computer simulations, just like the above-mentioned process parameters are obtained. Each calculation model is assumed to be stored in the calculation-model database unit 23 that is incorporated in the controller 9 as indicated by the two-dot dashed lines in FIG. 1. The more calculation models the calculation-model database unit 23 stores, the more accurately the components the gas has at the predetermined position in the reaction furnace 3 and the concentration each gas component has will be measured as interpolated values during the film-forming process.

The controller 9 provided in this embodiment is designed to update the process parameters at the prescribed time intervals, even during the film-forming process, in accordance with the gas components at the predetermined position in the reaction furnace 3 and the concentration of each gas component, which the component-calculating unit 21 and concentration-calculating unit 22 calculate. Hence, the film-forming process can be performed on the wafer 2 in appropriate conditions. On the basis of the process parameters thus updated, the controller 9 controls the operating conditions of the above-mentioned devices, appropriately adjusting the components of the process gas 4, the concentration of each component, the atmosphere in the reaction furnace 3 and the conditions of the progressing film-forming process.

Moreover, the controller 9 calculates the difference between each process parameter updated on the basis of the values calculated by the component-calculating unit 21 and concentration-calculating unit 22, on the one hand, and the initial process parameter set at the start of the film-forming process, on the other hand. In accordance with the different, the controller 9 changes (corrects) the temperature and pressure in the reaction furnace 3, the flow rates and flow speeds of the feed gases A, B and C, the time of the film-forming process, and the like, to appropriate values. Hence, the film-forming process can be performed on the wafer 2 in appropriate conditions. This makes it possible to provide a semiconductor device that has thin films of desired quality.

The process parameters updated in accordance with the values calculated by the component-calculating unit 21 and concentration-calculating unit 22, and the difference between each updated process parameter and the initial process parameter set at the start of the film-forming process are stored into the process-parameter database unit 20, every time the updating and calculation are carried out. Thus, the more times the film-forming apparatus 1 performs the film-forming process, the more choices of appropriate conditions for the film-forming process. This renders it possible to carry out the film-forming process on the wafer 2 at the best possible conditions. A semiconductor device having thing films of higher quality can, therefore, be obtained.

The controller 9 used in the present embodiment can perform a plurality of preset sequences of film-forming process. It can therefore perform different types of film-forming processes on the wafer 2, each in appropriate conditions. Further, the controller 9 is configured to select and perform one of the sequences of film-forming process, which meets the conditions of the film-forming step that follows the film-forming step being carried out when the component-calculating unit 21 and concentration-calculating unit 22 make calculations. The conditions of the film-forming step that follows the film-forming step being carried out are that the next step is hardly influenced by the film-forming step now undergoing, so that the film-forming process may be performed on the wafer 2 in appropriate conditions. The process sequence that satisfies such conditions is selected in accordance with the values calculated by the component-calculating unit 21 and concentration-calculating unit 22.

The process sequences are stored in the process-sequence database unit 24 that is provided in the controller 9, as is indicated by two-dot dashed lines in FIG. 1. The greater the number (types) of process sequences stored in the process-sequence database unit 24, the more appropriate the conditions will be, in which the film-forming process can be carried out to provide a semiconductor device that has thin films of higher quality.

As described above, in the film-forming apparatus 1 that is an apparatus for manufacturing a semiconductor device, which is the first embodiment of the invention, the gas components and the concentration of each gas component are directly monitored in real time at one position on the upstream of the wafer 2 and at one position on the downstream of the wafer 2, during the film-forming process being performed on the wafer 2 held in the reaction furnace 3. The components that the gas has and the concentration that each gas component has, at the predetermined positions in the reaction furnace 3, are calculated in real time from the values thus monitored. Thereafter, the values calculated are fed back, in real time, to the conditions in which the film-forming process is being carried out, so that the film-forming process may be appropriately carried out on the wafer 2. Hence, the film-forming process can be accomplished, while being appropriately controlled.

With the film-forming apparatus 1 thus configured, the components that the gas has and the concentration that each gas component has, at the predetermined positions in the reaction furnace 3, can be monitored in real time and with high precision. Additionally, the controller 9 incorporated in the film-forming apparatus 1 can accurately determine the conditions in which a thin film is being formed on the wafer 2, from the signals sent from the thermometer 11, pressure gauge 12, first to third mass-flow controllers **14*a*, 14*b* and 14*c*, first mass analyzer 15, second mass analyzer 19 and the like. The process parameters (control parameters) can therefore be changed to appropriate values, if necessary in view of the conditions of forming the thin film, to perform the film-forming process on the wafer 2** in appropriate conditions, regardless of the type of the film-forming process. This makes it easy to provide a semiconductor device that has thin films of desired quality.

In the film-forming apparatus 1 of the structure described above, the process parameters, the calculation model and the process sequence can be changed or selected by virtue of the real-time feedback control that the controller 9 accomplishes in accordance with the gas components and the concentration of each gas component at the predetermined position in the reaction furnace 3. Thus, the uncontrollable disturbance (uncontrollable factor or uncontrollable parameter), such as the amount of water introduced into the reaction furnace 3 as explained in regard to the conventional technique, need not be used as a process parameter. Hence, the film-forming process can be reliably controlled, robust (or hardly susceptible) to such disturbance.

A method of manufacturing a semiconductor device, according to the first embodiment of this invention, will be described. The method of manufacturing a semiconductor device, according to the first embodiment, is, to be specific, a film-forming method that uses the film-forming apparatus 1 described above.

In the film-forming method, of the gas introduced in the reaction furnace 3, the gas to be introduced into the reaction furnace 3 and the gas exhausted from the reaction furnace 3, the components of the gas in the reaction furnace 3 or the components of at least two gases and the concentration of each component of the gas are first measured, at two or more different positions in the reaction furnace 3, gas inlet pipe 5 and gas outlet pipe 6. Then, the components of the process gas 4, the concentration of each component, and the atmosphere in the reaction furnace 3 are adjusted on the basis of the values measured, so that an appropriate film-forming process may be carried out on the wafer 2 held in the reaction furnace 3.

The film-forming method according to this embodiment is carried out by the use of the film-forming apparatus 1 described above. The operation and advantages of the method are therefore similar to those of the film-forming apparatus 1. That is, the film-forming method according to the present embodiment can change the process parameters (control parameters) to appropriate values, if necessary. Thus, the film-forming process can be appropriately effectuated, irrespective of its type, in accordance with the conditions in which a thin film is being formed on the wafer 2. The method can therefore manufacture a semiconductor device having thin films of desired quality.

A cleaning method for use in an apparatus for manufacturing a semiconductor device, according to the present embodiment, will be described. The cleaning method according to the first embodiment is performed by the use of the film-forming apparatus 1 that has been described.

Film-forming apparatuses perform film-forming processes such as oxidation and CVD. Generally, a cleaning process must be carried out in, for example, a CVD apparatus, to remove residues (attached objects) deposited on the inner walls of the reaction furnace 3 after the film-forming process is completed. The film-forming apparatus 1 can be effectively applied to this cleaning process.

Generally, the optimal conditions in a cleaning process vary, depending on the kind of the attached object to be removed. One film-forming apparatus may perform film-forming processes of various types. In this case, the attached object to be removed may vary, depending on the time (process stage) when the cleaning should be carried out. As indicated above, the film-forming apparatus 1 can detect, in real time, the gas components in the reaction furnace 3 and the concentration of each gas component. Therefore, it is very easy for the apparatus 1 to determine the kind of the object to be removed at the time of performing the cleaning process. Further, optimal cleaning conditions can be set in accordance with the kind of the object to be removed, so that the interior of reaction furnace 3 and the like can be cleaned with ease.

Various materials of films may deposit, forming an attached object that is a multi-layer structure composed of layers of different materials. If this is the case, the cleaning conditions must be changed in accordance with the kind of the object that should be removed. Nonetheless, the optimal cleaning conditions can be easily set in accordance with the kind of the object to be removed, thereby to clean the interior of the reaction furnace 3 or the like with ease. This is because the film-forming apparatus 1 monitors, in real time, changes in the gas components in the reaction furnace 3 and changes in the concentration of each gas component.

That is, the film-forming apparatus 1 can easily detect the kind and components of the residue deposited in the furnace.

It can then select an optimal cleaning sequence in accordance with the kind and components of the residue.

As has been explained, in the cleaning method for use in an apparatus for manufacturing a semiconductor device, according to the first embodiment of this invention, the wafer 2 is removed from inside the reaction furnace 3 after the film-forming apparatus 1 has performed a film-forming process on the wafer 2. Then, a cleaning gas that can remove the residue from inside the gas inlet pipe 5, reaction furnace 3 and gas outlet pipe 6 is prepared on the basis of the values measured by the first mass analyzer 15 and second mass analyzer 19. Additionally, the atmosphere in the reaction furnace 3 is so set to increase the fluidity of the gas and residue that remains in the reaction furnace 3. Thereafter, the cleaning gas is made to flow from the gas inlet pipe 5 to the gas outlet pipe 6 through the reaction furnace 3 until the residue is taken out of the gas inlet pipe 5, reaction furnace 3 and gas outlet pipe 6.

One film-forming apparatus 1 may be used to repeat a film-forming process several times on the wafer 2. In this case, the components of the cleaning gas and the concentration of each gas component are adjusted every time the film-forming process ends, in accordance with the process sequence. They are adjusted on the basis of the values measured by the first and second mass analyzers 15 and 19 and/or the gas components at the predetermined position in the reaction furnace 3 and the concentration of each gas component determined from the values measured by the mass analyzers 15 and 19. The cleaning gas is then made to flow while the atmosphere in the reaction furnace 3 is being adjusted on the basis of the process parameters that have been updated as described above.

In the cleaning method for use in a method of manufacturing a semiconductor device, according to the first embodiment, the unnecessary components that may interfere with the film-forming process are removed from the gas inlet pipe 5 and reaction furnace 3 after the film-forming process has been carried out on the wafer 2. Hence, the next film-forming process can be performed in appropriate conditions, and the interior of the gas inlet pipe 5 and the interior of the reaction furnace 3 can remain clean. The film-forming processes can therefore be performed on the wafer 2 in appropriate conditions, regardless of their types. This serves to manufacture desirable semiconductor devices easily.

(Second Embodiment)

An apparatus for, and method of, manufacturing a semiconductor device and a cleaning method for use in the apparatus for manufacturing a semiconductor device, both according to the second embodiment of this invention, will now be described with reference to FIG. 3. Any component identical to that of the first embodiment are designated at the same reference numeral and will not be described. The apparatuses for manufacturing a semiconductor device and the cleaning methods for use in a method of manufacturing a semiconductor device, according to the third to fifth embodiments of the invention, will be described in the same manner.

Figure 3:
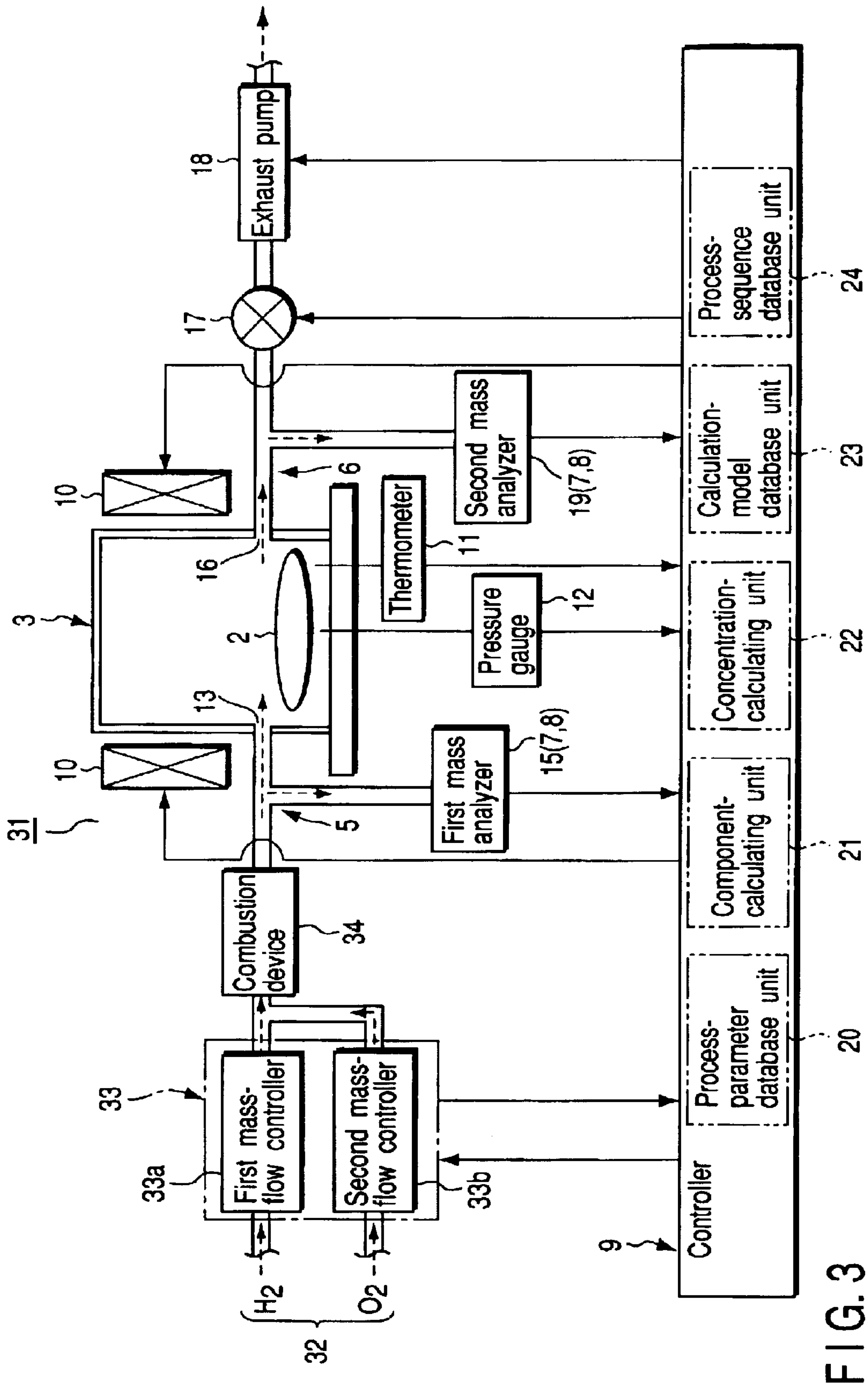
FIG. 3 is a schematic diagram illustrating the structure of a film-forming apparatus of wet oxidation type, which is an apparatus for manufacturing a semiconductor device, according to the second embodiment of this invention.

As may be seen from FIG. 3, the film-forming apparatus 31, which is an apparatus for manufacturing a semiconductor device, according to the present embodiment, is a wet-oxidation type that uses a process gas 32 composed of hydrogen and oxygen. The process gas 32 composed of hydrogen and oxygen is applied into the combustion device 34 coupled to the gas inlet pipe 5, before introduced via the gas inlet pipe 5 into the reaction furnace 3 by a controller 33. The controller 33 comprises first and second mass-flow controllers 33*a* and 33*b* that are provided for hydrogen and oxygen, respectively. The process gas 32 composed of hydrogen and oxygen is combusted in the combustion device 34 and then introduced into the reaction furnace 3. The second embodiment described above can attain the same advantages as the first embodiment.

(Third Embodiment)

An apparatus for, and method of, manufacturing a semiconductor device, and a cleaning method for use in the apparatus of manufacturing a semiconductor device, both according to the third embodiment of the present invention, will now be described with reference to FIG. 4.

Figure 4:
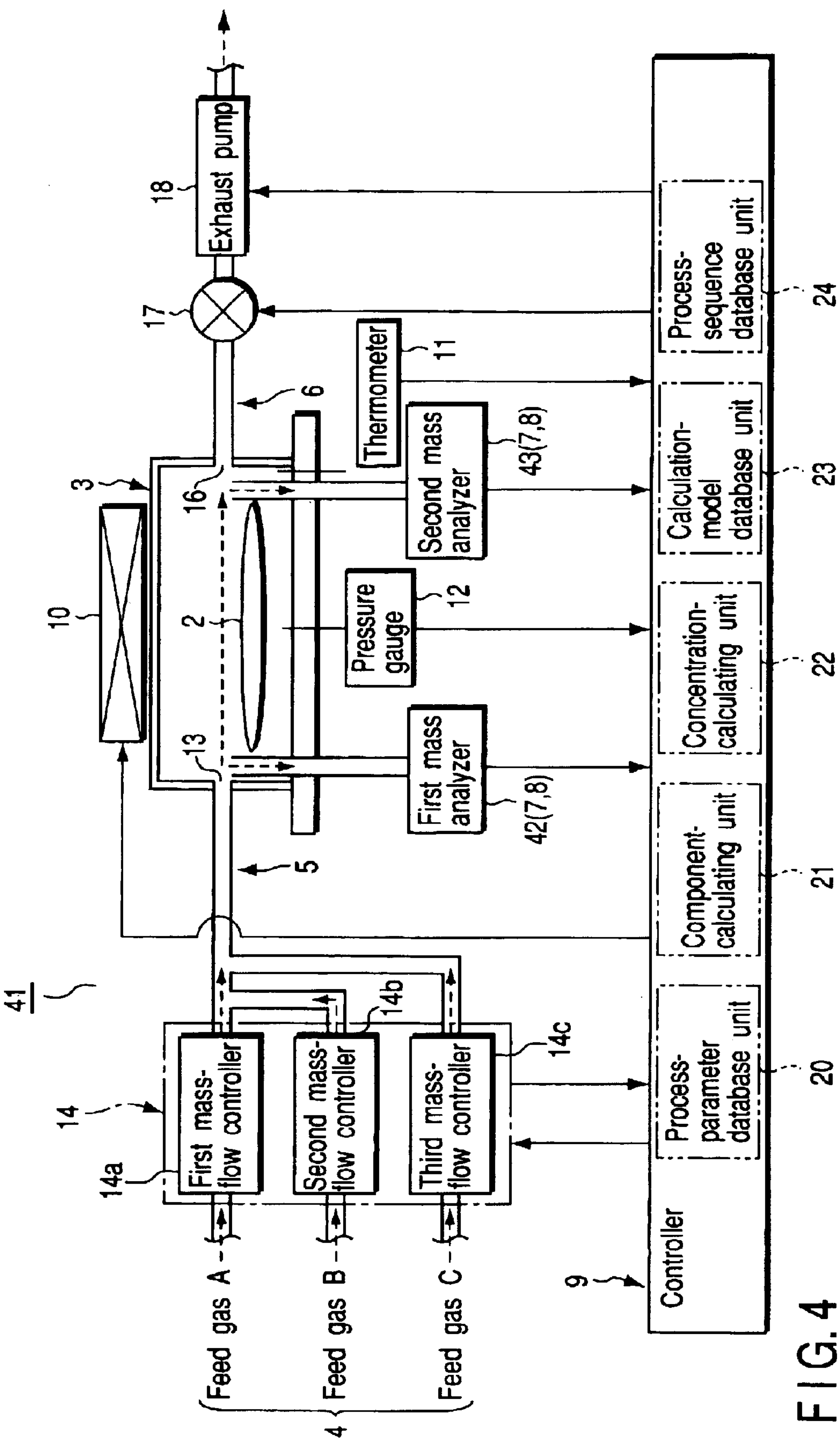
FIG. 4 is a schematic diagram depicting the structure of a film-forming apparatus that is an apparatus for manufacturing a semiconductor device, according to the third embodiment of the invention.

As FIG. 4 shows, a film-forming apparatus 41 according to this embodiment, i.e., an apparatus for manufacturing a semiconductor device, has the first mass analyzer 42. The analyzer 42 is provided in a reaction furnace 3 and positioned on the upstream side of a wafer 2 and near the gas inlet port 13. The apparatus 41 has the second mass analyzer 43. The analyzer 43 is provided in the reaction furnace 3, too, and located on the downstream side of the wafer 2 and near the gas outlet port 16.

The third embodiment described above can achieve the same advantages as the first embodiment. In the film-forming apparatus 41 according to the present embodiment, the first mass analyzer 42 is provided in the reaction furnace 3 and fixed on the upstream of the wafer 2 and near the gas inlet port 13. And the second mass analyzer 43 is provided in the reaction furnace 3 and secured on the downstream side of the wafer 2 and near the gas outlet port 16. Having this positional relation, the analyzers 42 and 43 monitor the components of the gas in the reaction furnace 3 and the concentration of each gas component. Thus, the components the gas has at a predetermined position in the reaction furnace 3 and the concentration of each gas component can be obtained with higher precision than otherwise. Thus, the film-forming process can be performed on the wafer 2 in more appropriate conditions, irrespective of the type of the process. This makes it easy to provide a semiconductor device of higher quality.

(Fourth Embodiment)

An apparatus for, and method of, manufacturing a semiconductor device, and a cleaning method for use in the apparatus for manufacturing a semiconductor device, both according to the fourth embodiment of the present invention, will now be described with reference to FIG. 5.

Figure 5:
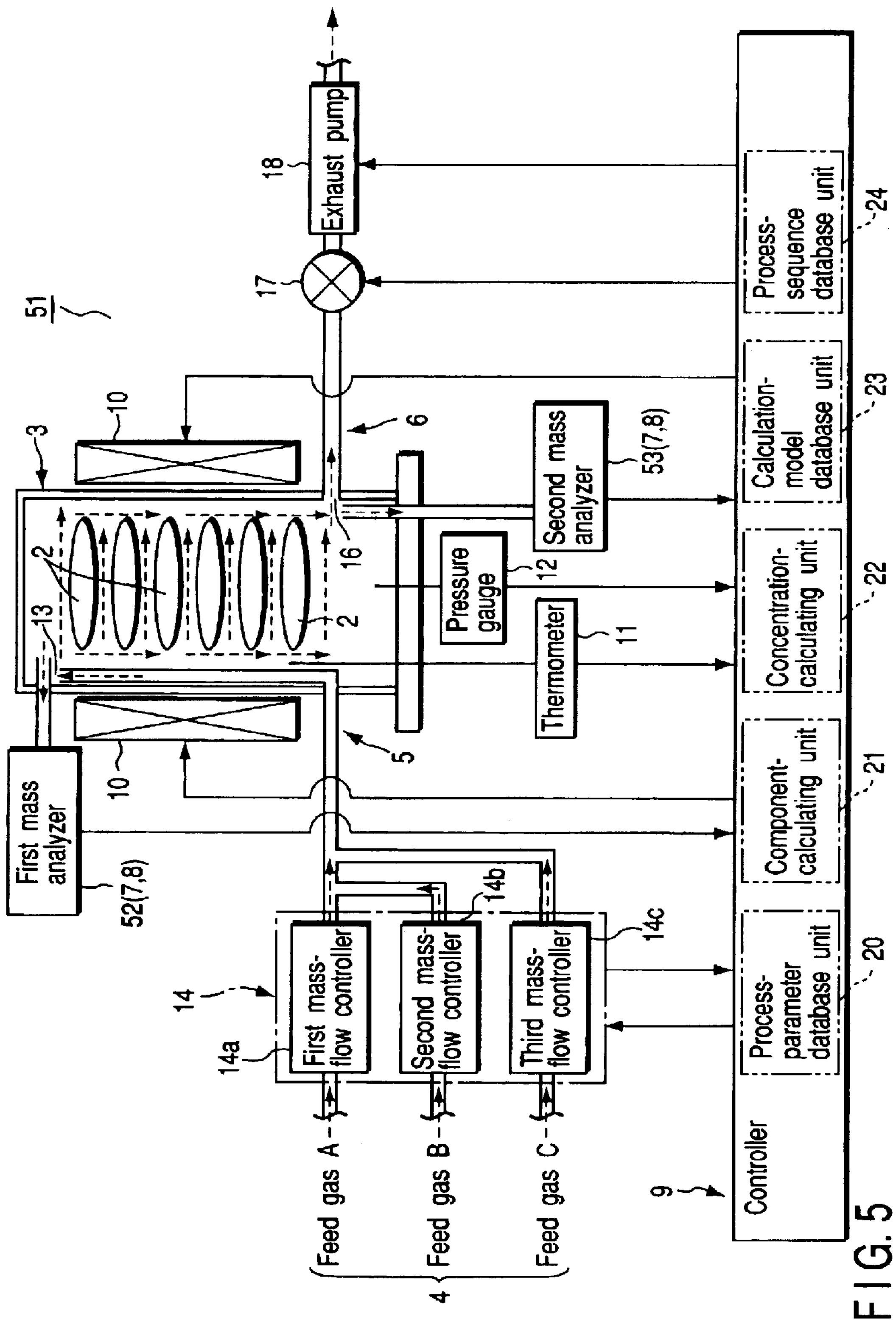
FIG. 5 is a schematic diagram showing the structure of a film-forming apparatus of batch type that is an apparatus for manufacturing a semiconductor device, according to the fourth embodiment of this invention.

As may be seen from FIG. 5, a film-forming apparatus 51 according to this embodiment, i.e., an apparatus for manufacturing a semiconductor device, is a film-forming apparatus of batch type. Thus, a plurality of wafers 2, for example six wafers, are held in the reaction furnace 3 at the same time. In the film-forming apparatus 51, the gas inlet pipe 5 extends in the reaction furnace 3, almost reaching the ceiling thereof. The gas inlet port 13 of the gas inlet pipe 5 therefore lies near the uppermost one of the six wafers 2. The first mass analyzer 52 is provided in the reaction furnace 3 and located on the upstream side of the uppermost wafer 2 and near the gas inlet port 13. The second mass analyzer 53 is provided in the reaction furnace 3, too, and positioned on the downstream side of the lowermost wafer 2 and near the gas outlet port 16.

The fourth embodiment described above can achieve the same advantages as the first embodiment. In the film-forming apparatus 51 according to this embodiment, the first mass analyzer 52 and the second mass analyzer 53 are secured at the positions specified above. The analyzers 52 and 53 can therefore measure the components the gas has at a predetermined position in the reaction furnace 3 and the concentration of each gas component, with higher precision, though the film-forming apparatus 51 is a batch-type one. Hence, the film-forming process can be performed on the wafer 2 in more appropriate conditions, regardless of the type of the process. This makes it easy to provide a semiconductor device of higher quality. Moreover, the apparatus 51 can manufacture a high-quality semiconductor device with high efficiency, since it is a batch-type apparatus.

(Fifth Embodiment)

Figure 7:
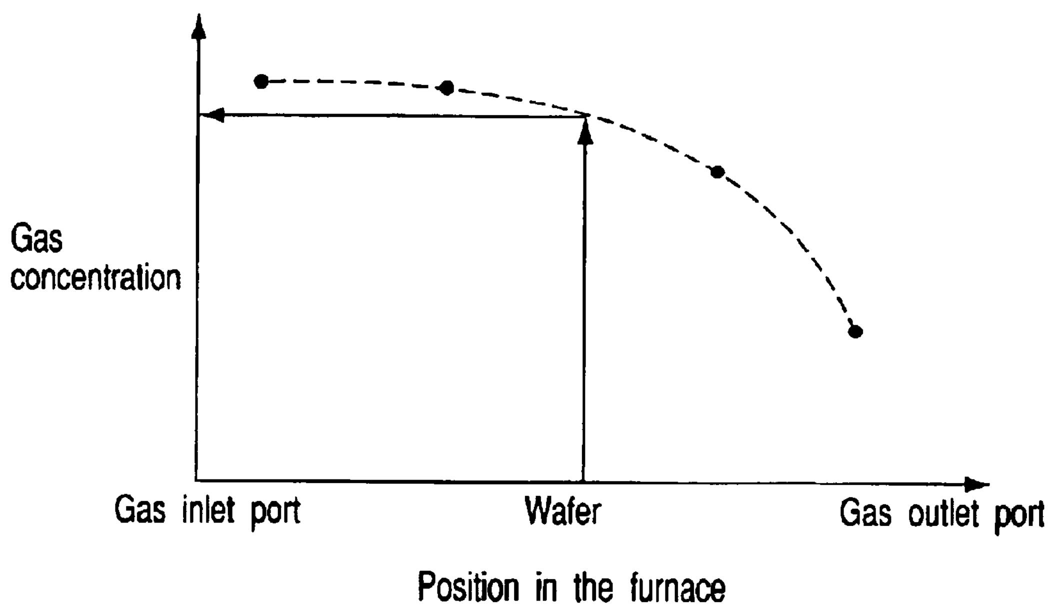
FIG. 7 is a graph explaining a method of determining the gas concentration in the reaction furnace provided in the film-forming apparatus shown in FIG. 6.

An apparatus for, and method for, manufacturing a semiconductor device, and a cleaning method for use in the apparatus for manufacturing a semiconductor device, both according to the fifth embodiment of the invention, will now be described with reference to FIGS. 6 and 7.

Figure 6:
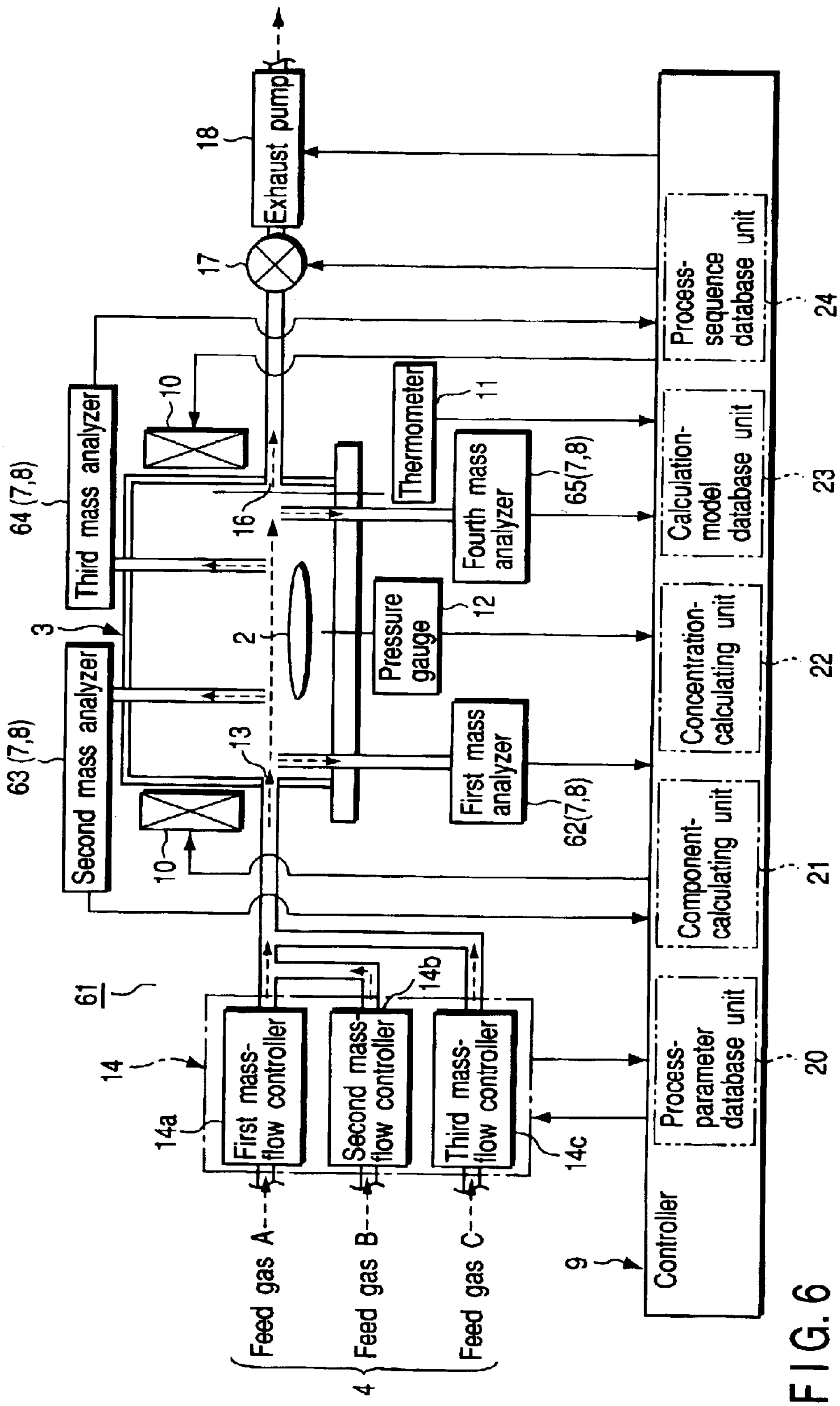
FIG. 6 is a schematic diagram illustrating the structure of a film-forming apparatus that is an apparatus for manufacturing a semiconductor device, according to the fifth embodiment of the invention.

As FIG. 6 depicts, the film-forming apparatus 61 according to this embodiment, which is an apparatus for manufacturing a semiconductor device, comprises four mass analyzers 62, 63, 64 and 65. The analyzers 62 to 65 are provided in the reaction furnace 3 and arranged along the gas flow. In the reaction furnace 3, the first mass analyzer 62 is located on the upstream side of the wafer 2 and near the gas inlet port 13. In the reaction furnace 3, the second mass analyzer 63 is positioned on the upstream side of the wafer 2 and immediately adjacent to the wafer 2. In the reaction furnace 3, the third mass analyzer 64 lies on the downstream side of the wafer 2 and quite close to the wafer 2. In the reaction furnace 3, the fourth mass analyzer 43 is located on the downstream side of the wafer 2 and near the gas outlet port 16.

The fifth embodiment described above can attain the same advantages as the first embodiment. In the film-forming apparatus 61 according to the fifth embodiment, the four mass analyzers 62, 63, 64 and 65 are secured at the positions specified above. They can therefore detect, with an extremely high precision, the components the gas has at predetermined positions in the reactor furnace 3 and the concentration of each gas component, as is indicated by the broken line shown in FIG. 7. Hence, the film-forming process can be performed on the wafer 2 in very appropriate conditions, regardless of the type of the process. This makes it easy to provide a semiconductor device of very high quality.

Any apparatus for, and any method for, manufacturing a semiconductor device, and any cleaning method for use in the apparatus for manufacturing a semiconductor device, according to the present invention, are not limited to the first to fifth embodiments described above. The embodiments may be modified in structure and in some of the steps, in various ways. Alternatively, various settings may be combined and utilized.

For example, each embodiment described above uses mass analyzers, each comprising a component-measuring device and a concentration-measuring device, as means for monitoring the components of the process gas in the gas inlet pipe 5, reaction furnace 3 and gas outlet pipe 6 and the concentration of each component of the process gas. The mass analyzers are not limited to this type, nonetheless. Mass analyzers of any other type may be employed instead, provided that they can accurately analyze the gas components and the concentration of each gas component.

In each embodiment described above, the process-parameter database unit 20, process-parameter database unit 20, concentration-calculating unit 22, calculation-model database unit 23 and process-sequence database unit 24 are incorporated in the controller 9 and formed integral with one another. Nevertheless, the process-parameter database unit 20, process-parameter database unit 20, concentration-calculating unit 22, calculation-model database unit 23 and process-sequence database unit 24 may be provided in an apparatus for manufacturing a semiconductor device, according to this invention, each arranged outside the controller 9 and operating independent of any other device.

Furthermore, apparatus for, and any method for, manufacturing a semiconductor device, and any cleaning method for use in the apparatus for manufacturing a semiconductor device, according to the present invention, can be applied to various hot processes, such as thermal oxidation, thermal nitriding, annealing, RTP, and CVD and the like.

Additional advantages and modifications will readily occur to those skilled in the art. Therefore, the invention in its broader embodiments is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, in which a substrate to be processed is held in a process chamber and a process gas is introduced into the process chamber to perform a prescribed process on the substrate, said method comprising: measuring components of the gas in the process chamber or at least two different gases selected from the group comprising of gas in the process chamber, gas to be introduced into the process chamber and gas discharged from the process chamber and also measuring a concentration of each component of the gas or gases, at two or more positions selected from the group comprising of a position in the process chamber, a position in a gas inlet pipe and a position in a gas outlet pipe, the gas inlet pipe being connected and communicating with an interior of the process chamber and configured to introduce the process gas for use in the process, into the process chamber, and the gas outlet pipe being connected and communicating with the interior of the process chamber and configured to discharge the gas from the process chamber to outside the process chamber; and adjusting the concentration of each component of the process gas and an atmosphere in the process chamber, on the basis of values thus measured, such that an appropriate process is performed on the substrate.

2. A method according to claim 1, wherein the components of at least one gas selected from the group comprising of the gas to be introduced into the process chamber and the gas in the process chamber and the concentration of each component of said at least one gas are measured at one or more positions on a side of the substrate held in the process chamber, said side of the substrate being at upstream of the gas flowing from the gas inlet pipe to the gas outlet pipe through the process chamber and of the gas flowing in the process chamber; and the components of at least one gas selected from the group comprising of the gas in the process chamber and the gas discharged from the process chamber and the concentration of each component of said at least one gas are measured at one or more positions on a side of the substrate, said side of the substrate being at downstream of the substrate.

3. A method according to claim 1, wherein the components of the gas in the process chamber and the concentration of each of these gas components are measured, the components the gas has at a predetermined position in the process chamber and at almost the same time these values and the concentration of each of theses gas components are calculated on the basis of these values, a plurality of process parameters for setting the components of the process gas, the concentration of each component thereof, the atmosphere in the process chamber and progress of the process, each at a prescribed condition, are updated on the basis of the values calculated, and the components of the process gas, the concentration of each component thereof, the atmosphere in the process chamber and the progress of the process are adjusted on the basis of the process parameters thus updated, in order to perform the process on the substrate in appropriate conditions.

4. A method according to claim 2, wherein the components the process gas has and the concentration each gas component has, before the process gas is introduced into the process chamber, are measured at one or more positions in the gas inlet pipe, and the components any gas in the process chamber has and the concentration each component of this gas has, before discharged from the process chamber, are measured at one or more positions in the gas outlet pipe.

5. A method according to claim 2, wherein the components of the gas in the process chamber and the concentration of each component of this gas are measured at least one position on the upstream side of the substrate held in the process chamber, and at least one position on the downstream side of the substrate.

6. A method according to claim 2, wherein a plurality of substrates to be processed are held in the process chamber, and the components of the process gas in the process chamber and the concentration of each component thereof are measured at least one position in the process chamber and at an upstream side of the substrate which is held upstream of any other substrate, and at least one position in the process chamber and at an downstream side of the substrate which is held downstream of any other substrate.

7. A method according to claim 2, wherein the components of the process gas in the process chamber and the concentration of each component thereof are measured at least one position near a gas inlet port which is open and provided at that end of the gas inlet pipe which communicates with the interior of the process chamber, and at least one position near a gas outlet port which is open and provided at that end of the gas outlet pipe which communicates with the interior of the process chamber.

8. A method according to claim 3, wherein the prescribed process is repeated on the substrate, the components the gas has, and the concentration of each gas component has, at a predetermined position in the process chamber, are calculated, and one of process sequences, which meets the condition of a process step to be carried immediately after the components of the gas and the concentration of each component thereof are calculated, is selected on the basis of the values calculated, in order to process the substrate in appropriate conditions.

* * * * *